(12) United States Patent
Sawada

(10) Patent No.: US 7,933,428 B2
(45) Date of Patent: Apr. 26, 2011

(54) MICROPHONE APPARATUS

(75) Inventor: Tatsuhiro Sawada, Niigata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/708,587

(22) Filed: Feb. 19, 2010

(65) Prior Publication Data
US 2010/0303273 A1 Dec. 2, 2010

(30) Foreign Application Priority Data

Jun. 2, 2009 (JP) ................. 2009-132823

(51) Int. Cl.
*H04R 9/08* (2006.01)
*H04R 19/04* (2006.01)
*H04R 25/00* (2006.01)
*H01L 29/84* (2006.01)

(52) U.S. Cl. ......... 381/357; 381/175; 381/360; 257/416

(58) Field of Classification Search ............ 381/26, 381/92, 91, 335, 122, 113, 345, 355, 356, 381/357, 360, 175, 191, 174; 257/245, 252, 257/254, 416, 419
See application file for complete search history.

(56) References Cited

U.S. PATENT DOCUMENTS

| 2005/0207605 | A1 | 9/2005 | Dehe et al. | |
| 2006/0140431 | A1* | 6/2006 | Zurek | 381/355 |
| 2006/0169049 | A1 | 8/2006 | Matsubara | |
| 2006/0262946 | A1* | 11/2006 | Yang | 381/175 |
| 2007/0041597 | A1 | 2/2007 | Song | |
| 2007/0058826 | A1 | 3/2007 | Sawamoto et al. | |
| 2007/0158826 | A1 | 7/2007 | Sakakibara et al. | |
| 2008/0192963 | A1 | 8/2008 | Sato | |
| 2008/0205668 | A1* | 8/2008 | Torii et al. | 381/113 |
| 2008/0318640 | A1 | 12/2008 | Takano et al. | |
| 2009/0001553 | A1 | 1/2009 | Pahl et al. | |
| 2009/0175477 | A1 | 7/2009 | Suzuki et al. | |
| 2010/0054495 | A1* | 3/2010 | Harney et al. | 381/92 |
| 2010/0092020 | A1* | 4/2010 | Ryan et al. | 381/355 |

FOREIGN PATENT DOCUMENTS

| JP | 2001-086588 | 3/2001 |
| JP | 2004-140629 | 5/2004 |
| JP | 2006-211468 | 8/2006 |
| JP | 2007-104556 | 4/2007 |
| JP | 2007-104582 | 4/2007 |
| JP | 2007-124449 | 5/2007 |
| JP | 2008-002953 | 1/2008 |
| JP | 2008-199353 | 8/2008 |
| JP | 2008-271426 | 11/2008 |
| JP | 2009-5071 | 1/2009 |
| JP | 2009-071813 | 4/2009 |
| JP | 2009-111622 | 5/2009 |

OTHER PUBLICATIONS

Notice of Reasons for Rejection of Japanese Patent Application No. 2009-132823 dated Jan. 5, 2010.

* cited by examiner

*Primary Examiner* — Curtis Kuntz
*Assistant Examiner* — Jesse A Elbin
(74) *Attorney, Agent, or Firm* — Panasonic Patent Center; Dhiren Odedra; Kerry Culpepper

(57) ABSTRACT

A microphone apparatus includes a mounting substrate, and at least two MEMS microphone elements mounted on the mounting substrate. The mounting substrate is provided with respective sound holes located directly under the MEMS microphone elements.

20 Claims, 6 Drawing Sheets

MICROPHONE APPARATUS

CROSS-REFERENCE TO RELATED APPLICATION

This application claims priority to Japanese Patent Application No. 2009-132823 filed on Jun. 2, 2008, the disclosure of which including the specification, the drawings, and the claims is hereby incorporated by reference in its entirety.

BACKGROUND

The present disclosure relates to microphone apparatuses, and more particularly to microphone apparatuses capable of directional sound pickup (including stereo sound pickup).

It is known that sensitivity of an array microphone, which includes a plurality of microphones arranged at given positions, obtains directivity by applying proper delays, and addition and subtraction to outputs from individual microphones utilizing a difference in acoustic paths from a sound source to the individual microphones.

For example, first and second microphone elements receive sound coming from a given direction. After the second microphone element receives the sound, the first microphone element receives the sound with a delay of Δt. In this case, when an output signal from the first microphone element is delayed by Δt, and then the delayed output signal is added to a signal obtained from the second microphone element, the same signals are superimposed. However, no superimposing effect can be obtained in sounds from other directions. Therefore, with respect to sound from the predetermined direction, the sound pickup sensitivity is improved to enable directional sound pickup.

That is, it is a prerequisite for obtaining directivity to have different acoustic paths from a sound source to microphone elements, which constitute an array microphone. If there are a plurality of acoustic paths from a single sound source to a single microphone element, conditions such as a delay amount and a coefficient for obtaining directivity cannot be properly set. This makes it difficult to obtain excellent directivity.

A first conventional example (see, e.g., Japanese Patent Publication No. 2007-104556, FIG. 1(*a*)) and a second conventional example (see, e.g., Japanese Patent Publication No. 2007-104582, FIG. 1) suggest mounting a pair of micro-electro mechanical system (MEMS) microphone elements, which prevent an acoustic path from being divided into a plurality of paths to enable stable directional sound pickup.

Structures of microphone apparatuses according to the first and second conventional examples will be described hereinafter with reference to FIGS. 6A and 6B.

FIG. 6A illustrates a cross-sectional structure of the microphone apparatus according to the first conventional example. FIG. 6B illustrates a cross-sectional view of the microphone apparatus according to the second conventional example.

As shown in FIG. 6A, in the microphone apparatus according to the first conventional example, a pair of MEMS microphone elements 111*a* and 111*b*, which are arranged in parallel to each other, are mounted on a common mounting substrate 165, and are housed in a capsule 164. The capsule 164 is provided with a partition wall 169 at a center. Each of cavities separated by the partition wall 169 is provided with a sound hole (167*a*, 167*b*). In this structure, sound reaching a sound hole provided in one of the microphone elements is not diffracted to reach the other microphone element, and acoustic paths (P1 and P2) can be integrated. This enables directional sound pickup by proper arithmetic processing. Note that FIG. 6A shows a silicon semiconductor substrate 112, a back plate 113, a spacer 114, a through hole 115 for letting air out, an air gap 116, a vibrating plate 133, a signal processor 162, bonding wires 163*a*-163*d*, and a sound source 168.

As shown in FIG. 6B, in the microphone apparatus according to the second conventional example, a pair of MEMS microphone elements 211*a* and 211*b*, which are arranged in parallel to each other, are mounted on a common mounting substrate 265, and are housed in a capsule 290, as in the above-described first conventional example. The capsule 290 has an acoustic transmissive mesh structure to prevent diffracted sound from leaking into the MEMS microphone elements 211*a* and 211*b*. In this structure, acoustic paths (P1 and P2) are integrated. This enables directional sound pickup by proper arithmetic processing. Note that FIG. 6B shows a silicon semiconductor substrate 212, a back plate 213, a spacer 214, a vibrating plate 233, a signal processor 262, bonding wires 263*a*-263*d*, and a sound source 268.

However, the above-described first and second conventional examples require the partition wall blocking the MEMS microphone elements from the surrounding space, or the acoustic transmissive mesh structure, respectively, to realize an independent acoustic path. This enables stable directional sound pickup. However, the present inventor has found that there arises a problem that assembly properties and cost efficiency are deteriorated with an increasing number of the components to reduce design flexibility of the substrates.

Furthermore, in order to miniaturize a microphone module, MEMS microphone elements themselves need to be miniaturized. At this time, capacity (the detail will be described later) of respective back air chambers of the MEMS microphone elements is reduced. The present inventor has found that there arises a problem that this leads to a decrease in sensitivity and an S/N ratio of the microphone.

Stereo microphones, which are generally used for video cameras, are required to have higher sensitivity than non-directional microphones used for mobile phones or the like. Therefore, when sensitivity and an S/N ratio of the microphone are to be obtained at given standard values, there have been limitations on miniaturization of MEMS microphone elements.

SUMMARY

In view of the foregoing, it is an objective to provide a directional microphone apparatus with excellent assembly properties and cost efficiency. It is another objective to provide a small-sized and high-sensitive directional microphone apparatus.

Accordingly, a structure of a microphone apparatus according to an exemplary embodiment will be described below.

A microphone apparatus of one embodiment includes a mounting substrate, and at least two MEMS microphone elements mounted on the mounting substrate. The mounting substrate is provided with a sound hole located directly under each of the MEMS microphone elements.

According to the microphone apparatus of this embodiment, since the sound holes are provided directly under the MEMS microphone elements, the MEMS microphone elements themselves can cut off sounds from the adjacent MEMS microphone elements. Thus, an independent acoustic path can be obtained without providing any partition wall as in the conventional example. As a result, the present apparatus can be implemented with fewer components than conventional stereo microphones, thereby improving design flexibility.

The microphone apparatus according to this embodiment may further include a cover formed on the mounting substrate to cover the MEMS microphone elements. The MEMS microphone elements may be arranged in a single cavity defined by the mounting substrate and the cover.

In this case, the MEMS microphone elements may share a single back air chamber formed by the cavity defined by the mounting substrate and the cover.

In this structure, the MEMS microphone elements share the back air chamber. Thus, capacity of the back air chamber becomes substantially larger than in the conventional examples. As a result, both of improvements in sensitivity and miniaturization of the MEMS microphone elements can be achieved.

In this case, the cover may be made of a conductive material.

Furthermore, the cover may be fixed to the mounting substrate with a conductive adhesive.

In the microphone apparatus according to this embodiment, the MEMS microphone elements may be arranged in two pairs. The MEMS microphone elements in each pair may be arranged to face each other. The mounting substrate may be provided with the sound hole located directly under each of the MEMS microphone elements. A line connecting the sound holes of the MEMS microphone elements in one pair may be orthogonal to a line connecting the sound holes of the MEMS microphone elements in the other pair.

In this structure, the MEMS microphone elements are arranged up and down, and left and right. Thus, sound in a vertical direction and in a horizontal direction can be picked up independently. As a result, the MEMS microphone elements are applicable to ambience microphones or directional microphones.

In the microphone apparatus according to this embodiment, each of the MEMS microphone elements may include a semiconductor substrate, a vibrating film formed on the semiconductor substrate, and a fixed film formed to face the vibrating film.

In this case, a part of the vibrating film may be made of an electret material.

In this structure, there is no need to supply charge to the MEMS microphone elements. Thus, the microphone apparatus can be miniaturized.

Furthermore, the vibrating film may be made of polysilicon. The fixed film may be made of an insulating film and polysilicon.

In the microphone apparatus according to this embodiment, each of the MEMS microphone elements may be fixed to the mounting substrate with a bonding material at a periphery.

In this case, the bonding material may be applied to the entire periphery of each of the MEMS microphone elements.

In this structure, since sound is prevented from leaking in the upper direction of the MEMS microphone elements, sound from the adjacent MEMS microphone elements can be reliably cut off.

The microphone apparatus according to this embodiment may further include a signal processor mounted on the mounting substrate, and performing given arithmetic processing in accordance with an output signal from each of the MEMS microphone elements.

Since the MEMS microphone elements and the signal processor are mounted on the common mounting substrate, each module has the function of directional sound pickup including stereo sound pickup. The number of the mounting modules can be reduced, when, for example, they are mounted in a set on a set product.

In this case, the signal processor and the MEMS microphone elements may be integrated in a single chip.

By integrating them in the single chip, the area required for a semiconductor wafer for the plurality of MEMS microphone elements and the signal processor can be reduced, thereby providing a cost advantage. Furthermore, no wire (e.g., wire bond) for coupling the plurality of MEMS microphone elements and the signal processor is required. This reduces costs for materials and assembly.

Furthermore, the signal processor and the mounting substrate may be electrically coupled to each other with a through electrode.

This structure requires no wire (e.g., wire bond) for coupling the plurality of MEMS microphone elements and the signal processor. This reduces the costs for materials and assembly. Time required for the assembly can also be reduced.

Furthermore, the signal processor may be flip-chip mounted on the mounting substrate.

In the microphone apparatus according to this embodiment, each of acoustic paths to the MEMS microphone elements from a single sound source is a single path passing through each of the sound holes provided directly under the MEMS microphone elements.

As described above, one embodiment provides a microphone apparatus capable of obtaining an independent acoustic path without providing any partition wall as in the conventional example. As a result, the present apparatus can be implemented with fewer components than conventional stereo microphones, thereby improving design flexibility.

DETAILED DESCRIPTION

Figure 1A:
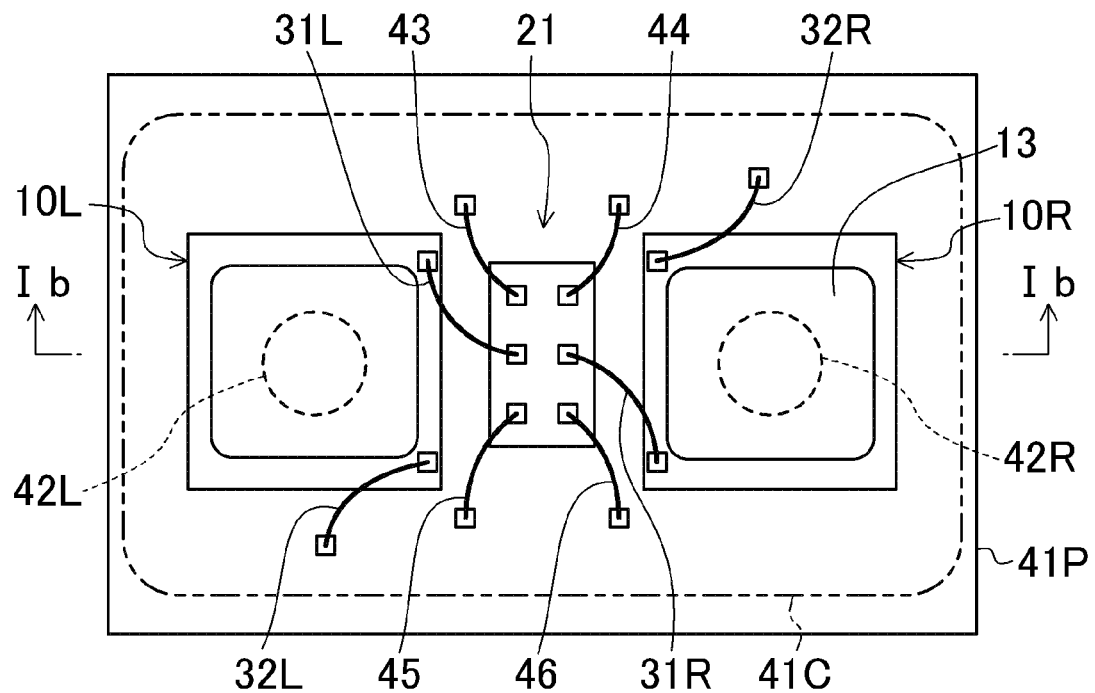
FIG. 1A is a plan view illustrating a structure of a MEMS microphone apparatus according to a first exemplary embodiment.

Exemplary embodiments of a microphone apparatus will be described hereinafter with reference to the drawings. The technical aspects will be clearly described in the drawings and the detailed description. Variations, modifications, and applications are apparent to those skilled in the art upon reading and understanding the preferable embodiments without departing from the scope or spirit of the present invention.

First Exemplary Embodiment

Figure 1B:
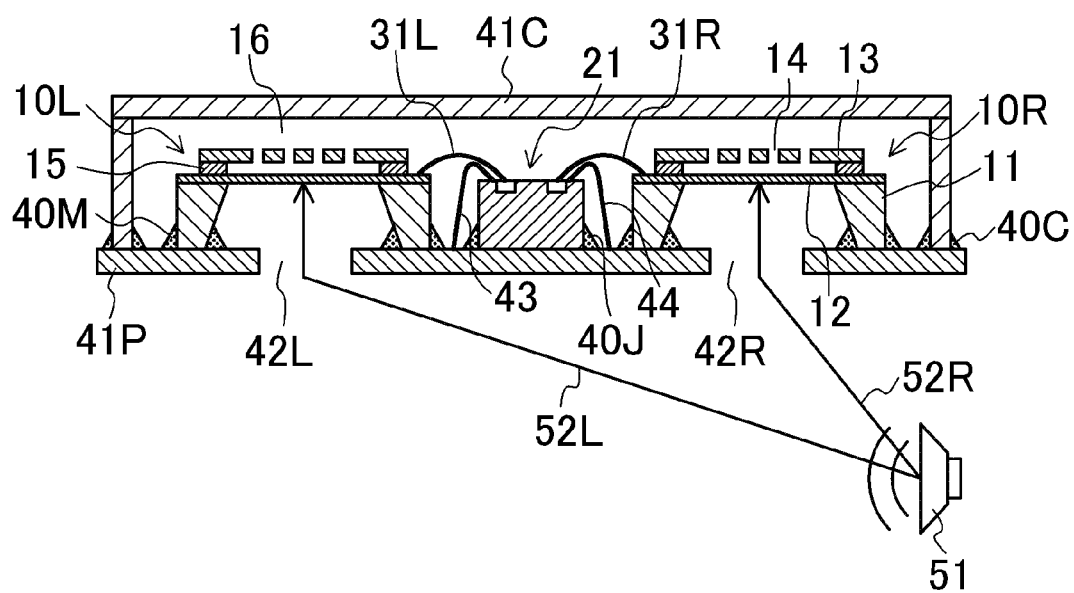
FIG. 1B is a cross-sectional view taken along the line Ib-Ib of FIG. 1A, and illustrates the structure of the MEMS microphone apparatus according to the first exemplary embodiment.

A MEMS microphone apparatus according to a first exemplary embodiment will be described hereinafter with reference to the drawings. FIG. 1A is a plan view illustrating a structure of the MEMS microphone apparatus according to the first exemplary embodiment. FIG. 1B is a cross-sectional view taken along the line Ib-Ib of FIG. 1A, and illustrates a structure of the MEMS microphone apparatus according to the first exemplary embodiment.

Basic Structure

As shown in FIGS. 1A and 1B, a mounting substrate 41P is provided with a sound hole 42L (a first sound hole) and a sound hole 42R (a second sound hole). A microphone element 10L (a first microphone element) and a microphone element 10R (a second microphone element) are mounted above the sound holes 42L and 42R, respectively. Each of the microphone elements 10L and 10R is a MEMS chip formed by micro-electro mechanical system (MEMS) technology of a semiconductor process. A silicon substrate is used for the MEMS chip. A not-shown insulating film is formed on a pedestal 11, which has been formed by etching through the silicon substrate. A vibrating film 12 made of conductive polysilicon is formed on the insulating film.

A fixed film 13 is formed over the vibrating film 12 to face the vibrating film 12 with an insulating material 15 such as borophospho silicate glass (BPSG) interposed therebetween. The fixed film 13 is formed of a multilayer of conductive polysilicon and a silicon oxide film or a silicon nitride film, and is provided with back holes (holes) 14. The back holes 14 in the fixed film 13 are provided to facilitate movement of the vibrating film 12. A gap is formed between the vibrating film 12 and the fixed film 13. The vibrating film 12, the fixed film 13, and the gap function as a capacitor. Note that, in the plan view of FIG. 1A, the back holes 14 provided in the fixed film 13 are not shown for the sake of simplicity.

The vibrating film 12 may be a multilayer film of an insulating film and conductive polysilicon, or may be a single layer film made of conductive polysilicon. A conductive film made of a material other than conductive polysilicon may be used, as long as it functions as a vibrating electrode. The fixed film 13 may be a multilayer film of an insulating film and conductive polysilicon, or may be a single layer film of conductive polysilicon. A conductive film may be used, which is made of a material other than conductive polysilicon, as long as it functions as a fixed electrode.

The vibrating film 12 and the fixed film 13 face each other with the gap interposed therebetween, thereby functioning as a capacitor. The vibrating film 12 may be formed over the fixed film 13 with a gap interposed therebetween. Furthermore, the gap can be formed by etching a sacrificial film, which is originally formed between the vibrating film 12 and the fixed film 13 through the back holes (holes) 14 provided in the fixed film 13. The remaining of the sacrificial film, which has not been removed in the etching process, can be used as the insulating material 15 supporting the fixed film 13.

An example formation process of the MEMS chips will be briefly described below.

First, the vibrating film 12 is formed on a silicon substrate. Then, a sacrificial film is formed on the vibrating film 12. Next, the fixed film 13 is formed on the sacrificial film. Then, the back holes (holes) 14 are formed in the fixed film 13. After that, the silicon substrate is through-etched to form the pedestal 11 having a through hole exposing the vibrating film 12. Then, the sacrificial film is etched and removed through the back holes (holes) 14 to form the gap between the vibrating film 12 and the fixed film 13. The remaining of the sacrificial film becomes the insulating material 15. With the use of this semiconductor microfabrication technology, the MEMS chips are formed.

A signal processor 21 is arranged between the microphone elements 10L and 10R. The signal processor 21 functions as an amplifier, and is formed from a complementary metal oxide semiconductor (CMOS) or an LSI.

When the gap between the vibrating film 12 and the fixed film 13 has a fixed area, the capacitance of the capacitor does not change. However, when sound from a sound source 51 reaches the vibrating film 12 through the sound holes 42L and 42R, the vibrating film 12 vibrates to change the area of the gap, thereby changing capacitance of the capacitor. The change in the capacitance is amplified by the signal processor 21, and is output as an electrical signal to extract a sound signal.

A cover 41C is mounted on the mounting substrate 41P to cover the microphone elements 10L and 10R, and the signal processor 21. The cover 41C is made of a conductive material such as nickel silver (i.e., an alloy of copper, zinc, and nickel), kovar, or 42 alloy having an electrical shield function. The cover 41C is fixed on the mounting substrate 41P with a bonding material 40C such as a solder or a conductive adhesive. Instead of using the cover 41C, the substrate materials may be bonded to each other to form a capsule. In the plan view of FIG. 1A, the cover 41C is indicated by a two-dot chain line for the sake of simplicity, and the inner structure of the cover 41C is shown.

The sound holes 42L and 42R can be formed in various shapes depending on the needs. For example, as shown in FIGS. 1A and 1B, a single sound hole may be formed, or a plurality of small sound holes may be arranged in a given area.

Mounting and Interconnection

In this exemplary embodiment, after mounting the signal processor 21 on the mounting substrate 41P, the microphone elements 10L and 10R are mounted. Then, a power source wire 45, GND wires 32L, 32R, and 46, output wires 31L, 31R, 43, and 44 are wire-coupled. Then, the cover 41C is mounted.

The signal processor 21 and the microphone elements 10L and 10R are mounted after applying or transferring bonding materials 40J and 40M such as thermoset epoxy adhesives to a mounting pattern on the mounting substrate 41P. Then, heat needed to cure the adhesives is applied so that the signal processor 21 and the microphone elements 10L and 10R are fixed.

Each of the microphone elements 10L and 10R includes an output terminal and a GND terminal. The output terminal is wire-coupled to an input terminal of the signal processor 21 with the first and second output wires (31L and 31R). The GND terminal is wire-coupled to the GND terminal on the mounting substrate 41P with the first and the second GND wires (32L and 32R). The output terminals of the microphone elements 10L and 10R are electrically coupled to the vibrating films 12 of the microphone elements 10L and 10R with leading wires. The GND terminals of the microphone elements 10L and 10R are electrically coupled to the fixed films 13 of the microphone elements 10L and 10R with leading wires.

A signal, which is output from the microphone elements 10L and 10R, is input to the signal processor 21 through the first and second output wires (31L and 31R), and is subjected to proper arithmetic processing, and is output through the output wires 43 and 44. The signal processor 21 is operated by power supplied from a power source terminal on the mounting substrate 41P through the power source wire 45. A GND terminal of the signal processor 21 is coupled to the GND terminal on the mounting substrate 41P with the GND wire 46. In this exemplary embodiment, the terminals and wires are electrically coupled by, for example, wire bonding using ultrasound.

The bonding material 40C for bonding the cover 41C to the mounting substrate 41P is continuously (entirely) applied to the periphery of the cover 41C to be cured and fixed. The bonding material 40M for bonding the above-described microphone elements 10L and 10R to the mounting substrate 41P is continuously (entirely) applied to the periphery of the pedestals 11 of the microphone elements 10L and 10R to be cured and fixed. With this configuration, sound leakage can be reduced, and sound from the sound source 51 is prevented from entering from a part other than the sound holes 42L and 42R. That is, acoustic paths 52L and 52R, which allow sound from the single sound source 51 to reach the microphone elements 10L and 10R, are the only (independent) paths passing through the sound holes 42L and 42R.

Furthermore, sound entering from the sound hole 42L or 42R to the microphone element 10L or 10R does not leak into the other of the microphone elements 10R and 10L. The MEMS chips have the function of cutting off sound from the adjacent MEMS chips (on the left or right side). As such, according to this exemplary embodiment, the acoustic paths can be integrated without providing an extra partition wall as in the first conventional example.

Note that the signal processor 21 can be directly coupled to the mounting substrate by flip-chip bonding (face-down mounting) using e.g., a thermoset conductive adhesive. This reduces the number of assembly processes such as wiring, thereby reducing costs for materials and assembly.

Operation

The operation of the apparatus in this exemplary embodiment will be described below.

When sound from the sound source 51 reaches the vibrating film 12 through the sound holes 42L and 42R, the vibrating film 12 vibrates to change the area of the gap, thereby changing the capacitance of the capacitor. Due to this feature of a microphone, it is known that important factors affecting the sensitivity of the microphone are the capacitance of the capacitor formed by the fixed film 13 and the vibrating film 12, and volume capacity of the back air chamber formed by the fixed film 13 and the vibrating film 12.

Figure 6A:
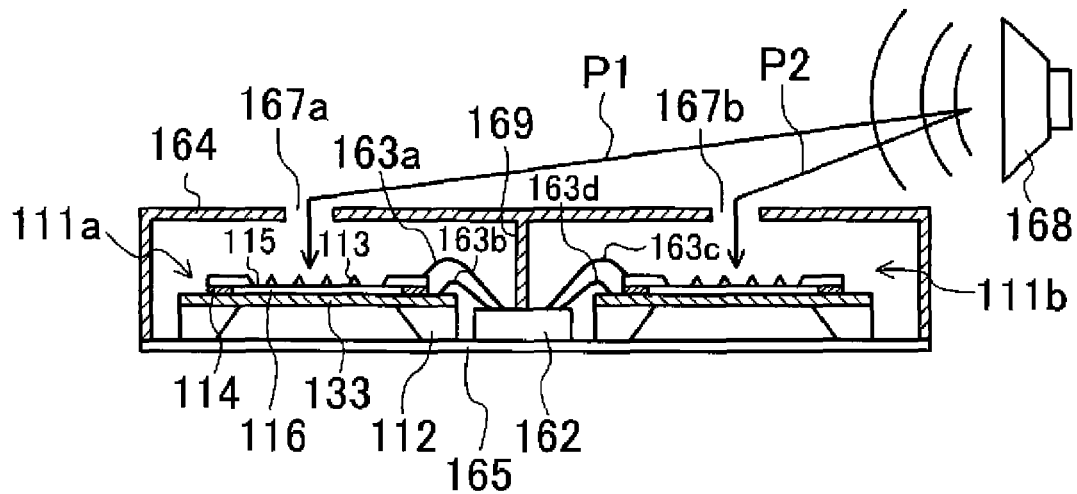
FIG. 6A is a cross-sectional view illustrating a structure of a MEMS microphone apparatus according to a first conventional example.
Figure 6B:
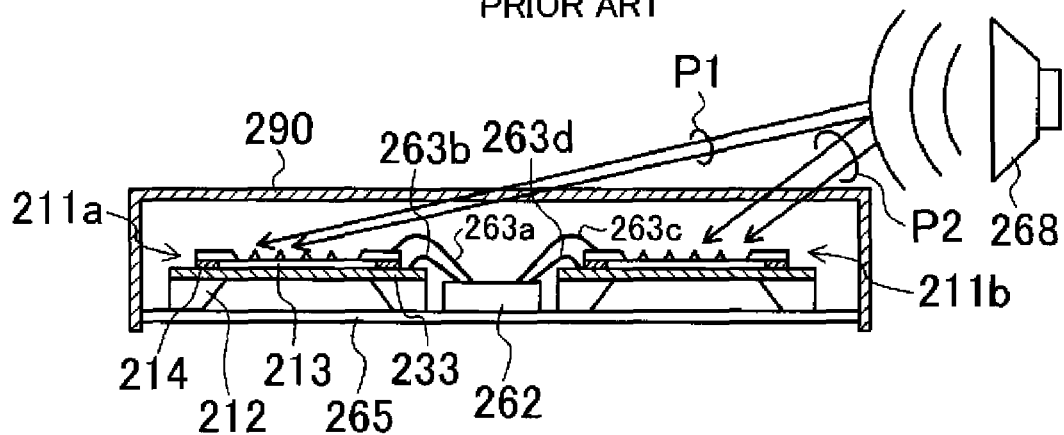
FIG. 6B is a cross-sectional view illustrating a structure of a MEMS microphone apparatus according to a second conventional example.

A back air chamber 16 is an enclosed cavity, which is on the opposite side to the sound holes 42L and 42R with respect to the vibrating film 12. For example, in the first and second conventional examples shown in FIGS. 6A and 6B, cavities (i.e., hollows directly under the vibrating plates 133 and 233), which are enclosed by the semiconductor substrates 112 and 212 of the MEMS microphone elements 111a and 211a, the vibrating plates 133 and 233, and the mounting substrates 165 and 265, correspond to back air chambers. In this exemplary embodiment, the cavity, which is enclosed by the cover 41C, the mounting substrate 41P, and the microphone elements 10L and 10R, corresponds to the back air chamber 16.

The sensitivity of the microphone is represented by the following formulas.

$$VOUT = Vm \times G$$

$$Vm \propto 1/(Sb+So)$$

VOUT represents the sensitivity, Vm represents an output of the MEMS, G represents gain, Sb represents stiffness of the back air chamber, and So represents stiffness of the vibrating film.

In the structures shown in the above first and second conventional examples (FIGS. 6A and 6B), with miniaturization of the MEMS chips, projected areas in the chips or the volume including the height direction is miniaturized. This results in a decrease in the volumes of the hollows directly under the vibrating plates 133 and 233, which function as the back air chambers. Thus, spring elasticity increases due to air in the back air chambers to raise the "Sb" in the formula (i.e., the stiffness of the back air chamber). This inhibits vibration of the vibrating plates 133 and 233. As a result, the "VOUT," (i.e., the sensitivity) which is the output of the microphone decreases to reduce the S/N ratio.

However, according to this exemplary embodiment, the sound holes 42L and 42R are provided directly under the two microphone elements 10L and 10R, respectively. Thus, the single cavity bounded (i.e., defined) by the cover 41C, the mounting substrate 41P, and the microphone elements 10L and 10R functions as the back air chamber 16. This allows the microphone elements 10L and 10R to share the back air chamber 16. This substantially increases the capacity of the back air chamber to realize a high-sensitive stereo microphone. The sensitivity of the MEMS microphone having sound holes at a higher position (in the conventional example) is compared to that of the MEMS microphone having sound holes at a lower position (i.e., this exemplary embodiment). With a 2.6×2.6 mm chip, the microphone sensitivity is improved by 1.7 dB on average, and the S/N ratio is improved by 1.0 dB on average. With a small chip such as 1×1 mm, the microphone sensitivity is improved by 6.5 dB on average, and the S/N ratio is improved by 5 dB on average. Therefore, it is found that the structure of this exemplary embodiment is useful, particularly in using a small MEMS chip.

Note that an electret material, which is a conductive film, may be formed in the vibrating film 12 so that charge is held in the electret material by a charging process. As a result, there is no need to supply power to the MEMS chips, thereby enabling miniaturization of the amplifier of the signal processor 21. In this exemplary embodiment, the signal processor 21 is arranged between the microphone elements 10L and 10R. The location is not limited thereto, and the signal processor 21 may be properly arranged in an area other than the areas provided with the microphone elements.

Second Exemplary Embodiment

Figure 2A:
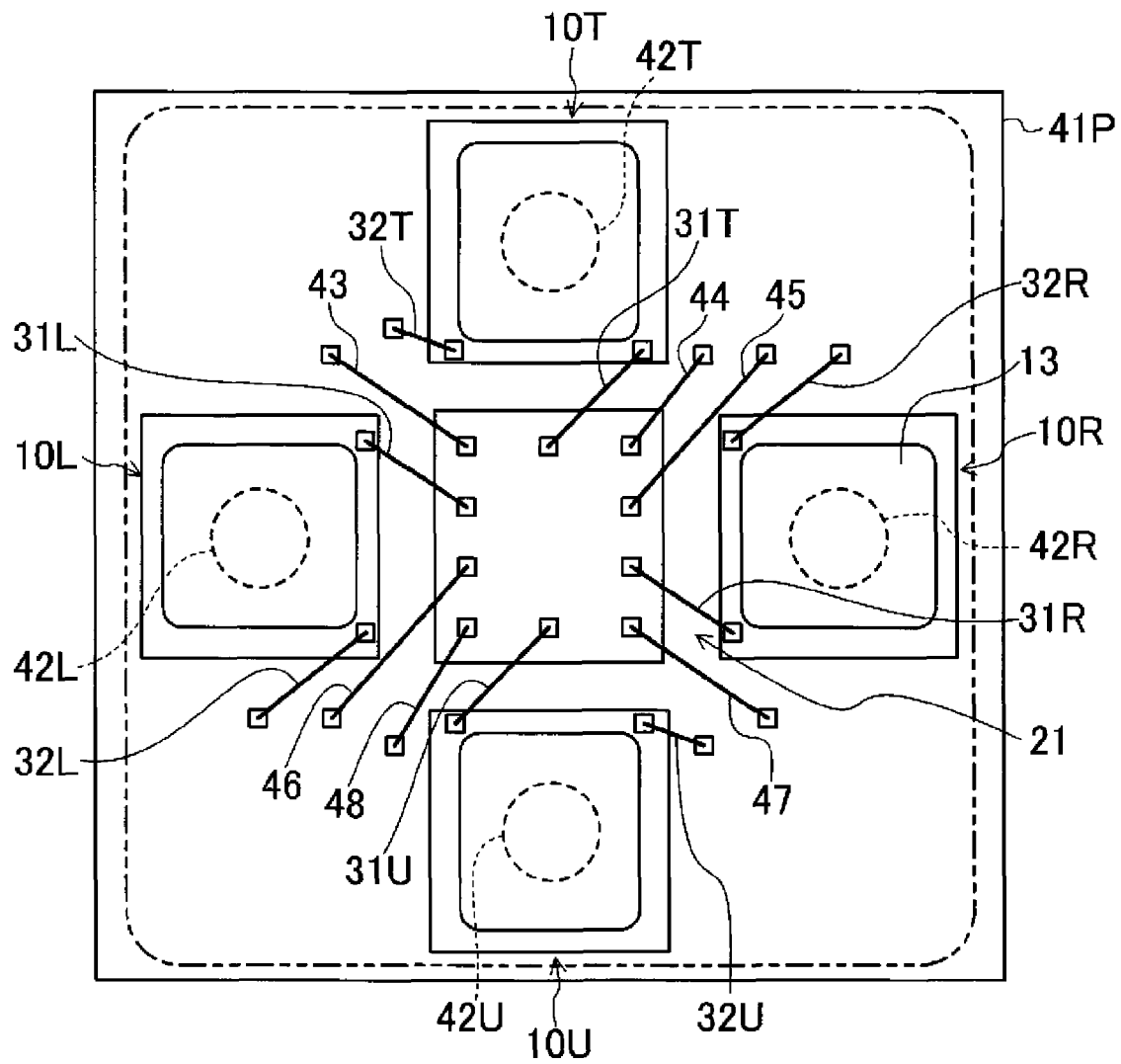
FIG. 2A is a plan view illustrating a structure of a MEMS microphone apparatus according to a second exemplary embodiment.
Figure 2B:
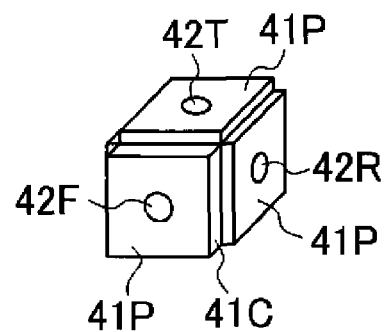
FIG. 2B is a perspective view illustrating a structure of a variation of the MEMS microphone apparatus according to the second exemplary embodiment.

A MEMS microphone apparatus according to a second exemplary embodiment will be described hereinafter with reference to the drawings. FIG. 2A is a plan view illustrating a structure of the MEMS microphone apparatus according to the second exemplary embodiment. FIG. 2B is a perspective view illustrating a structure of a variation of the MEMS microphone apparatus according to the second exemplary embodiment.

The MEMS microphone apparatus according to this exemplary embodiment includes three or more microphone elements described in the first exemplary embodiment, thereby enabling higher realistic sound pickup.

As shown in FIG. 2A, a mounting substrate 41P is provided with sound holes 42L, 42R, 42T, and 42U. A microphone element 10R (a first microphone element), 10L (a second microphone element), 10T (a third microphone element), and 10U (a fourth microphone element) are mounted on the sound holes 42L, 42R, 42T, and 42U, respectively. That is, the mounting substrate 41P is provided with the sound holes 42L, 42R, 42T, and 42U located directly under the microphone elements 10R, 10L, 10T, and 10U, respectively. A signal processor 21 is arranged in a central area surrounded by areas provided with the microphone elements 10L, 10R, 10T and 10U.

Signals output from the microphone elements 10L, 10R, 10T and 10U are input to the signal processor 21 through respective output wires (31L, 31R, 31T, and 31U). After proper arithmetic processing, the signals are output from the signal processor 21 through output wires 43, 44, 47, and 48. The microphone elements 10L, 10R, 10T and 10U, as well as the other parts of the signal processor 21 are configured similarly to those in the first exemplary embodiment. Similar to the microphone elements 10L and 10R, GND wires 32U and 32T are coupled to the microphone elements 10U and 10T, respectively.

In this exemplary embodiment, the sound holes 42L, 42R, 42T, and 42U as well as the microphone elements 10L, 10R, 10T and 10U are arranged so that the line, which connects centers of the sound holes 42L and 42R of the microphone elements 10L and 10R in a pair facing each other, is substantially orthogonal (with an angle about 90°±10°) to the line, which connects centers of the sound holes 42T and 42U of the microphone element 10T and 10U in a pair facing each other.

With this arrangement, stereo sound pickup can be individually performed in horizontal and vertical directions. For example, sound pickup in the horizontal direction is performed by the microphone elements 10L and 10R, and sound pick up in the vertical direction is performed by the microphone elements 10T and 10U. Each of the four microphone elements 10L, 10R, 10T and 10U has an independent acoustic path in a similar manner to the first exemplary embodiment. Outputs from the microphone elements are subjected to proper arithmetic processing to enable higher realistic sound pickup in the horizontal and vertical directions. Furthermore, the four microphone elements 10L, 10R, 10T and 10U share a back air chamber (see reference numeral 16 in FIG. 1B) to ensure given sensitivity and a given S/N ratio, while enabling miniaturization of the microphone elements 10L, 10R, 10T and 10U, and the modules.

The sound holes may be in any shape as described in the first exemplary embodiment. In this exemplary embodiment, the wording "center of the sound hole" refers to a geometric center in the shape of each of the sound holes (42L-42U). The location of the signal processor 21 is not limited to that shown in FIG. 2A. The signal processor 21 may be properly arranged in an area other than the areas provided with the MEMS chips.

The MEMS microphone apparatus according to this exemplary embodiment is not limited to have the planar structure as shown in FIG. 2A. One possible variation is shown in FIG. 2B. Microphone elements are mounted on a mounting substrate 41P provided with sound holes 42F, 42T, and 42R, and are fixed to a cover 41C formed in a cubic shape. This achieves a microphone module capable of sound pickup in a front-back direction in addition to horizontal and vertical directions. In this structure, six microphone elements share a back air chamber (see reference numeral 16 in FIG. 1B) to ensure given sensitivity and a given S/N ratio, while enabling miniaturization of the microphone elements and the modules. Note that a signal processor 21 may be mounted on the mounting substrate 41P, or may be appropriately arranged at other positions with proper interconnection.

Third Exemplary Embodiment

Figure 3A:
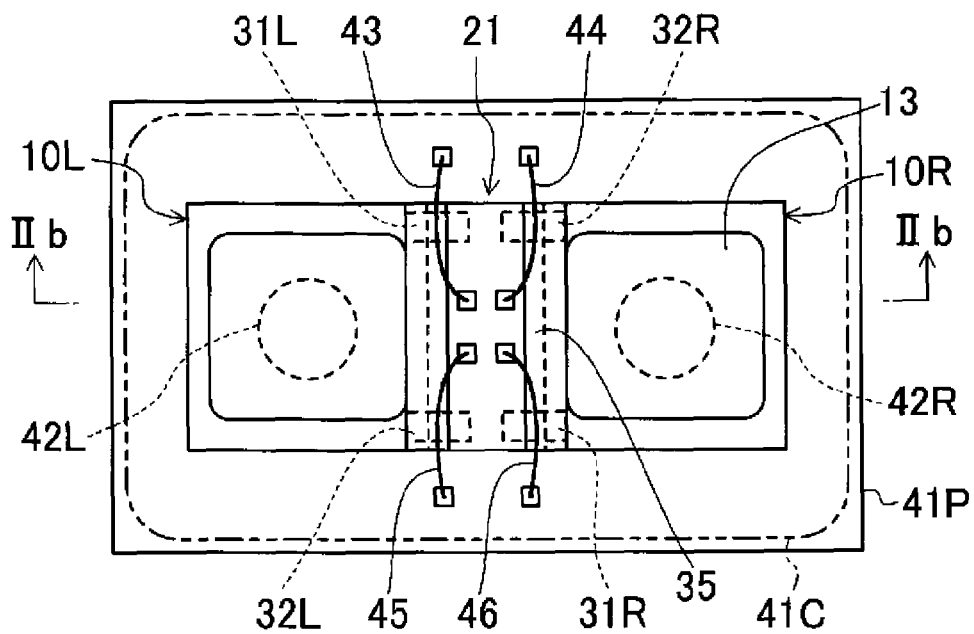
FIG. 3A is a plan view illustrating a structure of a MEMS microphone apparatus according to a third exemplary embodiment.
Figure 3B:
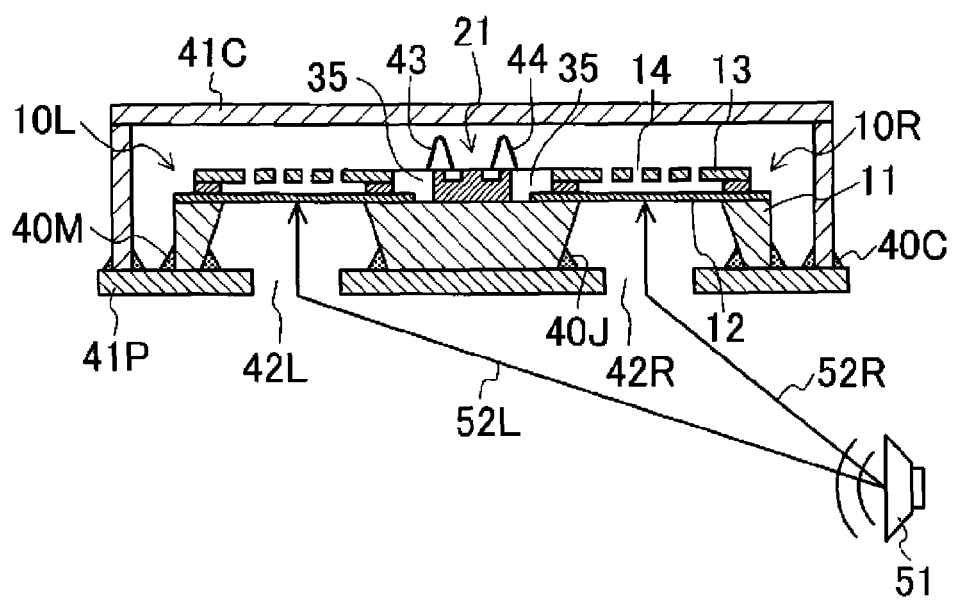
FIG. 3B is a cross-sectional view taken along the line IIIb-IIIb of FIG. 3A, and illustrates the structure of the MEMS microphone apparatus according to the third exemplary embodiment.

A MEMS microphone apparatus according to a third exemplary embodiment will be described hereinafter with reference to the drawings. FIG. 3A is a plan view illustrating a structure of the MEMS microphone apparatus according to the third exemplary embodiment. FIG. 3B is a cross-sectional view taken along the line IIIb-IIIb of FIG. 3A, and illustrates the structure of the MEMS microphone apparatus according to the third exemplary embodiment.

In the MEMS microphone apparatus according to this exemplary embodiment, the first and second microphone elements, and the signal processor described in the first exemplary embodiment are integrated in a chip.

As shown in FIGS. 3A and 3B, a mounting substrate 41P is provided with sound holes 42L and 42R. Microphone elements 10L and 10R are mounted over the sound holes 42L and 42R, respectively. A signal processor 21 is arranged so that insulators 35 are interposed between the signal processor 21, and the microphone elements 10L and 10R. The microphone elements 10L and 10R, and the signal processor 21 are integrated in a chip. That is, the microphone elements 10L and 10R, and the signal processor 21 are electrically disconnected by the insulators 35. Therefore, only desired signals can be input into the signal processor 21.

Signals output from the microphone elements 10L and 10R are output to the signal processor 21 through output lines (31L and 31R) formed inside the chip. After proper arithmetic processing, the signals are output through the output wires 43 and 44 formed of wires. GND lines (32L and 32R) of the microphone elements 10L and 10R are also formed inside the chip, and coupled to a GND terminal of the signal processor 21. Other structures are similar to those described in the first exemplary embodiment.

In a manufacturing process of the MEMS microphone apparatus according to this exemplary embodiment, the microphone elements (including a pedestal 11, vibrating films 12, and fixed films 13), the insulators 35, and the signal processor 21 are formed at the same time.

To be specific, the insulators 35 and the signal processor 21 are formed between the microphone elements 10L and 10R, before etching and removing a sacrificial film between the vibrating film 12 and the fixed film 13 to form a gap, and before etching through the silicon substrate to form a silicon through hole. Next, the silicon through hole is formed by etching through the silicon substrate. Then, the gap is formed by etching and removing the sacrificial film between the vibrating film 12 and the fixed film 13. As such, the microphone elements 10L and 10R, the insulators 35, and the signal processor 21 are formed.

As an alternative, the insulators 35 and the signal processor 21 are formed between the microphone elements 10L and 10R, before etching and removing the sacrificial film between the vibrating film 12 and the fixed film 13 to form the gap. Then, the gap is formed by etching the sacrificial film between the vibrating film 12 and the fixed film 13. In this manner, the microphone elements, the insulators 35, and the signal processor 21 may be formed.

The output lines (31L and 31R) within the chip may be formed by lithography and etching after depositing a metal film on an interlayer insulating film in the signal processor 21 and on the vibrating film 12 by sputtering. As an alternative, a trench is formed on the interlayer insulating film in the signal processor 21 and on the vibrating film 12 by patterning, and then, metal for interconnection is coated by electrolytic plating, on the interlayer insulating film and the vibrating film 12 including the trench. Then, the metal film is retained only in the trench by chemical mechanical polishing (CMP), thereby forming the output lines. As such, the output lines (31L and 31R) can be formed by a semiconductor process such as an etching method or a damascene method.

Furthermore, the GND lines (32L and 32R) within the chip may be formed by lithography or etching after depositing a metal film on the interlayer insulating film in the signal processor 21 and on the fixed film 13 by sputtering. As an alternative, a trench is formed on the interlayer insulating film in the signal processor 21 and on the fixed film 13 by patterning, and then, metal for interconnection is coated by electrolytic plating, on the interlayer insulating film and the fixed film 13 including the trench. Then, the metal film is retained only in the trench by CMP, thereby forming the GND lines. As such, the GND lines (32L and 32R) can be formed by a semiconductor process such as an etching method or a damascene method.

This exemplary embodiment requires fewer components than the above-described first exemplary embodiment. Furthermore, the output lines (31L and 31R) and the GND lines (32L and 32R) are buried within the single chip element, thereby reducing the number of wires. This reduces the height of the module and parasitic capacitance caused by the wires. By forming in the single chip, the plurality of microphone elements 10L and 10R share the pedestal 11 to improve the stiffness and the strength of the chip. This reduces differences in properties of the elements caused by stress induced in mounting the elements.

In this exemplary embodiment, the microphone elements 10L and 10R and the signal processor 21 are formed in the single chip. The structure is not limited thereto. As necessary, only the microphone elements 10L and 10R are formed in a single chip, and the signal processor 21 can be mounted as another part.

Fourth Exemplary Embodiment

Figure 4A:
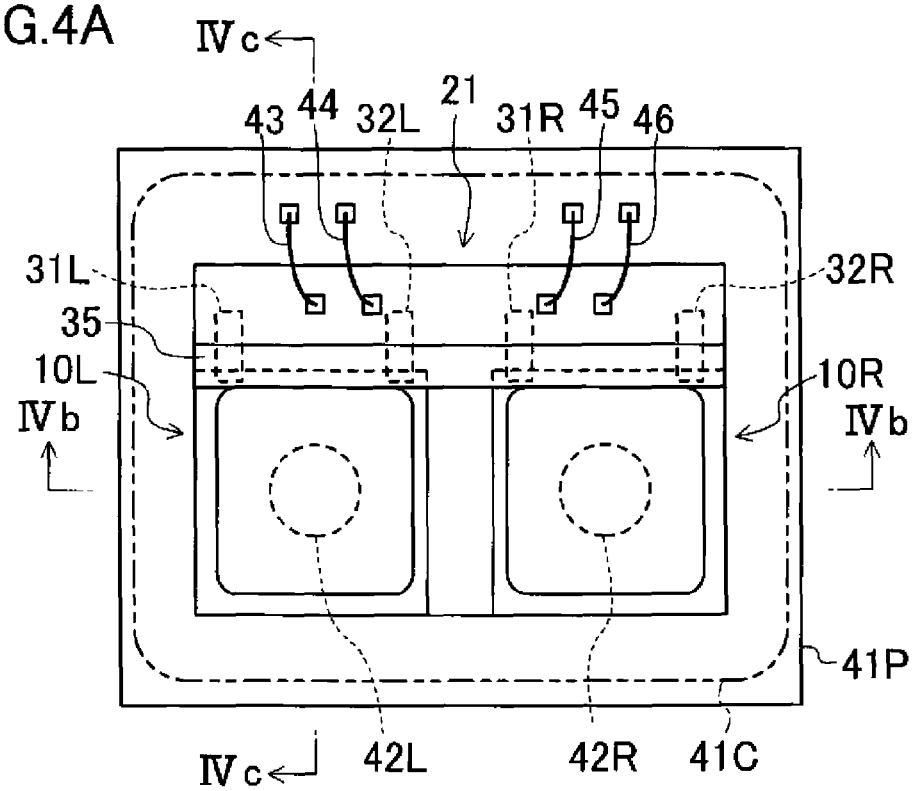
FIG. 4A is a plan view illustrating a structure of a MEMS microphone apparatus according to a fourth exemplary embodiment.
Figure 4B:
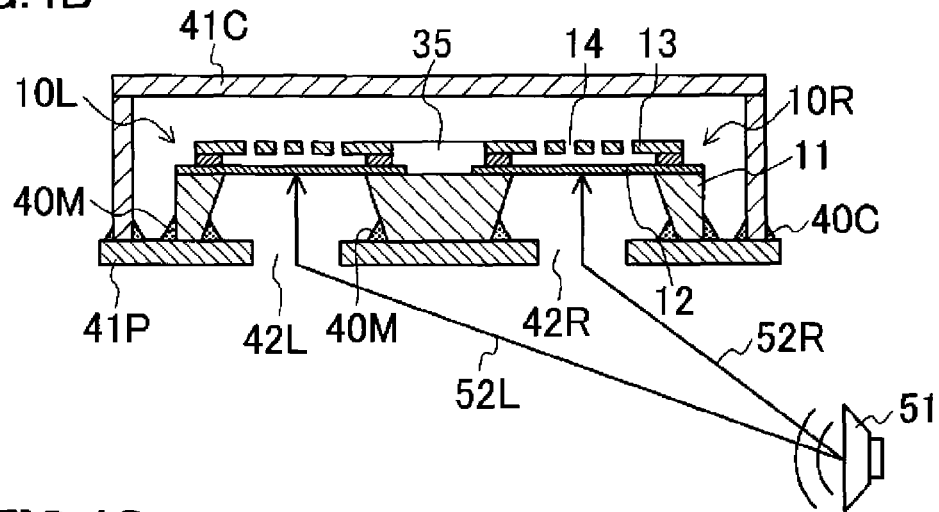
FIG. 4B is a cross-sectional view taken along the line IVb-IVb of FIG. 4A, and illustrates the structure of the MEMS microphone apparatus according to the fourth exemplary embodiment.
Figure 4C:
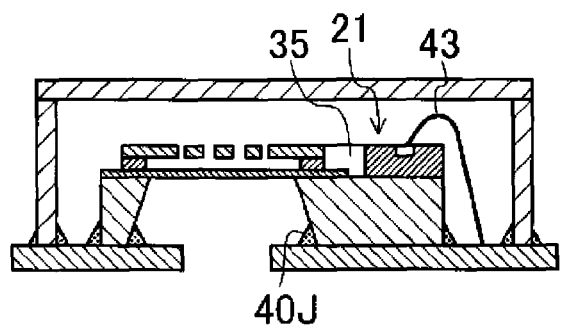
FIG. 4C is a cross-sectional view taken along the line IVc-IVc of FIG. 4A, and illustrates the structure of the MEMS microphone apparatus according to the fourth exemplary embodiment.

A MEMS microphone apparatus according to a fourth exemplary embodiment will be described hereinafter with reference to the drawings. FIG. 4A is a plan view illustrating a structure of the MEMS microphone apparatus according to the fourth exemplary embodiment. FIG. 4B is a cross-sectional view taken along the line IVb-IVb of FIG. 4A, and illustrates the structure of the MEMS microphone apparatus according to the fourth exemplary embodiment. FIG. 4C is a cross-sectional view taken along the line IVc-IVc of FIG. 4A, and illustrates the structure of the MEMS microphone apparatus according to the fourth exemplary embodiment.

The MEMS microphone apparatus according to this exemplary embodiment has another arrangement of the microphone elements 10L and 10R, and the signal processor 21 formed in the single chip in the above-described third exemplary embodiment.

As shown in FIGS. 4A-4C, in the MEMS microphone apparatus according to this exemplary embodiment, the microphone elements 10L and 10R, which are formed in the single chip in the above-described third exemplary embodiment, are arranged in a line. The output terminals of the microphone elements 10L and 10R are arranged parallel to the line. The signal processor 21 is also arranged parallel to the line. This arrangement increases a projected area in the pedestal 11 of the microphone elements 10L and 10R to increase the strength of the microphone elements 10L and 10R formed in the single chip.

Fifth Exemplary Embodiment

Figure 5A:
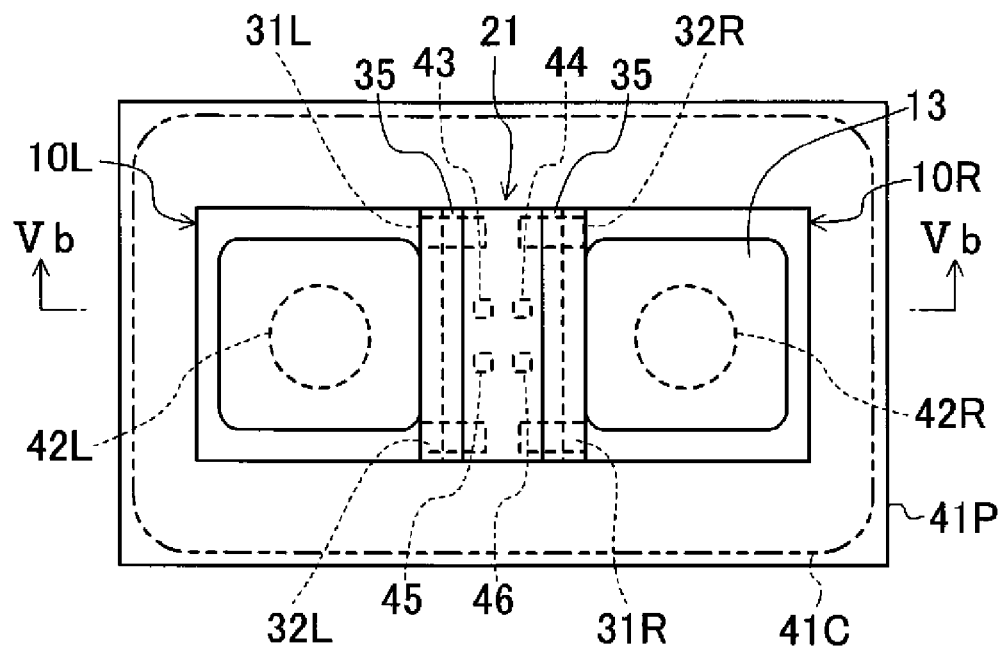
FIG. 5A is a plan view illustrating a structure of a MEMS microphone apparatus according to a fifth exemplary embodiment.
Figure 5B:
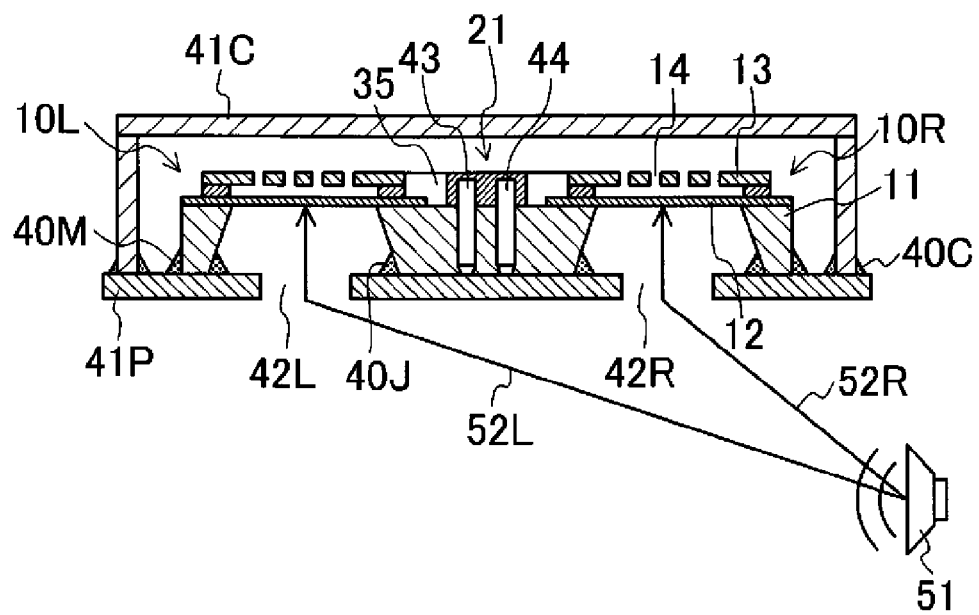
FIG. 5B is a cross-sectional view taken along the line Vb-Vb of FIG. 5A, and illustrates the structure of the MEMS microphone apparatus according to the fifth exemplary embodiment.

A MEMS microphone apparatus according to a fifth exemplary embodiment will be described hereinafter with reference to the drawings. FIG. 5A is a plan view illustrating a structure of the MEMS microphone apparatus according to the fifth exemplary embodiment. FIG. 5B is a cross-sectional view taken along the line Vb-Vb of FIG. 5A, and illustrates the structure of the MEMS microphone apparatus according to the fifth exemplary embodiment.

The MEMS microphone apparatus according to this exemplary embodiment has another structure and arrangement of the output terminals of the elements, which are formed in the single chip in the above-described third exemplary embodiment.

As shown in FIGS. 5A and 5B, in the MEMS microphone apparatus according to this exemplary embodiment, the output terminals of the elements, which are formed in the single chip in the above-described third exemplary embodiment, are arranged on a part of a mounting substrate 41P, on which a pedestal 11 under a signal processor 12 is formed. Output lines 43 and 44, a power source line 45, and a GND line 46 are provided as through electrodes formed by through-silicon via (TSV) technology.

The respective through electrodes constituting the output lines 43 and 44, the power source line 45, and the GND wire 46 are formed by burying metal such as copper (Cu) or polysilicon in through holes formed in a bare chip. In this exemplary embodiment, the through holes are formed by e.g., dry etching to penetrate the pedestal 11 and reach the inside of a signal processor 21. Then, side wall insulating films are formed in the through holes by chemical vapor deposition (CVD). Furthermore, copper (Cu) as a material for the through electrodes is filled in the through holes by plating, and then, the surfaces are planarized by CMP. As such, the through electrodes are formed, through which the mounting substrate 41P and the signal processor 12 are electrically coupled to each other.

When mounted on the mounting substrate 41P, the respective through electrodes constituting the output lines 43 and 44, the power source line 45, and the GND wire 46 are directly electrically coupled to the mounting substrate 41P by a process such as anisotropic conductive paste (ACP) or stud bump bonding (SBB).

This exemplary embodiment requires no wire for coupling a plurality of MEMS chips to the signal processor 12, thereby reducing costs for materials and assembly. Furthermore, parasitic capacitance caused by the wire can be reduced.

The structures of the microphone apparatus according to the various exemplary embodiments are useful for reducing the number of components in a microphone apparatus and miniaturization of the apparatus.

What is claimed is:

1. A stereo microphone apparatus comprising:
a mounting substrate;
at least two MEMS microphone elements mounted on the mounting substrate; and
a cover formed on the mounting substrate to cover the MEMS microphone elements, wherein
the mounting substrate is provided with respective sound holes in the mounting substrate located directly under the MEMS microphone elements, and
the MEMS microphone elements share a single chamber defined by the mounting substrate and the cover.

2. The stereo microphone apparatus of claim 1, further comprising:
   a first output wire and a second output wire, wherein
   the at least two MEMS microphone elements comprise a first MEMS microphone element and a second MEMS microphone element, and
   the first output wire and the second output wire corresponding to the first MEMS microphone element and the second MEMS microphone element respectively are connected to the substrate.
3. The stereo microphone apparatus of claim 2, wherein
   the MEMS microphone elements are arranged in two pairs, and
   the alignment of one pair is orthogonal to the alignment of the other pair.
4. The stereo microphone apparatus of claim 3, wherein a part of the vibrating film is made of an electret material.
5. The stereo microphone apparatus of claim 3, wherein the vibrating film is made of polysilicon, and
   the fixed film is made of an insulating film and polysilicon.
6. The stereo microphone apparatus of claim 2, wherein each of the MEMS microphone elements includes a semiconductor substrate, a vibrating film formed on the semiconductor substrate, and a fixed film formed to face the vibrating film.
7. The stereo microphone apparatus of claim 2, wherein each of the MEMS microphone elements has a single path passing through each of the sound holes directly under the MEMS microphone elements respectively.
8. The stereo microphone apparatus of claim 1, wherein the chamber and the sound holes are acoustically separated by the each of the MEMS microphone elements mounted on the mounting substrate.
9. The stereo microphone apparatus of claim 1, wherein a bonding material is applied to the entire periphery of each of the MEMS microphone elements so that the chamber and the sound holes are acoustically separated by the each of the MEMS microphone elements.
10. The stereo microphone apparatus of claim 9, wherein the MEMS microphone elements are arranged in two pairs, and the alignment of one pair is orthogonal to the alignment of the other pair.
11. The stereo microphone apparatus of claim 9, wherein each of the MEMS microphone elements includes a semiconductor substrate, a vibrating film formed on the semiconductor substrate, and a fixed film formed to face the vibrating film.
12. The stereo microphone apparatus of claim 1, wherein the cover is made of a conductive material.
13. The stereo microphone apparatus of claim 1, wherein the cover is fixed to the mounting substrate with a conductive adhesive.
14. The stereo microphone apparatus of claim 1, wherein the MEMS microphone elements include are arranged in two pairs, and
   the alignment of one pair is orthogonal to the alignment of the other pair.
15. The stereo microphone apparatus of claim 1, wherein each of the MEMS microphone elements includes a semiconductor substrate, a vibrating film formed on the semiconductor substrate, and a fixed film formed to face the vibrating film.
16. The stereo microphone apparatus of claim 1, further comprising
   a signal processor mounted on the mounting substrate, and performing given arithmetic processing in accordance with an output signal from each of the MEMS microphone elements.
17. The stereo microphone apparatus of claim 16, wherein the signal processor and the MEMS microphone elements are integrated in a single chip.
18. The stereo microphone apparatus of claim 16, wherein the signal processor and the mounting substrate are electrically coupled to each other with a through electrode.
19. The stereo microphone apparatus of claim 16, wherein the signal processor is flip-chip mounted on the mounting substrate.
20. The stereo microphone apparatus of claim 1, wherein each of the MEMS microphone elements has a single path passing through each of the sound holes directly under the MEMS microphone elements respectively.

* * * * *